United States Patent
Best et al.

(10) Patent No.: US 11,877,418 B2
(45) Date of Patent: Jan. 16, 2024

(54) ASSEMBLY OF AN ELECTRONIC DEVICE HAVING AN ELECTRONICS HOUSING AND A BASE STRIP

(71) Applicant: Phoenix Contact GmbH & Co.KG, Blomberg (DE)

(72) Inventors: Frank Best, Bueckeburg (DE); Eduard Unger, Herford (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 17/794,272

(22) PCT Filed: Jan. 20, 2021

(86) PCT No.: PCT/EP2021/051100
§ 371 (c)(1),
(2) Date: Sep. 2, 2022

(87) PCT Pub. No.: WO2021/148423
PCT Pub. Date: Jul. 29, 2021

(65) Prior Publication Data
US 2023/0074501 A1   Mar. 9, 2023

(30) Foreign Application Priority Data

Jan. 21, 2020 (DE) ..................... 10 2020 101 321.3

(51) Int. Cl.
*H05K 7/14* (2006.01)
(52) U.S. Cl.
CPC ................................. *H05K 7/1469* (2013.01)

(58) Field of Classification Search
CPC .... H05K 7/1469; H01R 12/70; H01R 13/633; H01R 27/02; H01R 9/24; H01R 9/2408; H01R 25/16; H01R 13/639; H01R 4/4827
See application file for complete search history.

(56) References Cited

U.S. PATENT DOCUMENTS

| | | | | |
|---|---|---|---|---|
| 5,159,534 A * | 10/1992 | Hudson | ................ | H05K 7/1439 361/736 |
| 6,093,041 A * | 7/2000 | Kay | ..................... | H01R 9/2408 439/225 |
| 9,039,460 B2 * | 5/2015 | Hackemack | ......... | H01R 9/2608 439/716 |

(Continued)

FOREIGN PATENT DOCUMENTS

DE  102014106277 A1  1/2019
EP  2945229 A1  11/2015

*Primary Examiner* — Rockshana D Chowdhury
*Assistant Examiner* — Douglas R Burtner
(74) *Attorney, Agent, or Firm* — LEYDIG, VOIT & MAYER, LTD.

(57) ABSTRACT

An assembly of an electronic device includes: an electronics housing for accommodating an electronic component; a base strip attachable to the electronics housing and having a plurality of plug receptacles to which plug modules are attachable; and a locking apparatus for locking the plug modules to the plug receptacles of the base strip. The locking apparatus has an actuating part movable in an actuating direction toward the electronics housing in order to remove the plug modules from the base strip. A spring element is arranged on the electronics housing for preloading the actuating part in relation to the electronics housing counter to the actuating direction.

15 Claims, 14 Drawing Sheets

(56) References Cited

U.S. PATENT DOCUMENTS

| | | | | |
|---|---|---|---|---|
| 9,257,788 B1* | 2/2016 | Jia | ............................ | G06F 1/187 |
| 9,356,390 B2* | 5/2016 | Annis | ................ | H01R 13/6272 |
| 9,806,462 B2* | 10/2017 | Wendt | .................. | H01R 4/5008 |
| 9,806,481 B2* | 10/2017 | Best | ..................... | H01R 9/2408 |
| 11,196,212 B2* | 12/2021 | Ramsey | ........... | H01R 13/62933 |
| 11,276,970 B1* | 3/2022 | Dittus | ..................... | H01R 27/00 |
| 2014/0077832 A1* | 3/2014 | Hackemack | .......... | G01R 1/0416 |
| | | | | 324/755.05 |
| 2014/0194007 A1* | 7/2014 | Cech | .................... | H05K 7/1477 |
| | | | | 439/631 |
| 2015/0333423 A1* | 11/2015 | Busch | ................ | H01R 12/7076 |
| | | | | 439/78 |
| 2015/0333441 A1* | 11/2015 | Annis | ................ | H01R 13/6272 |
| | | | | 439/157 |
| 2016/0268748 A1* | 9/2016 | Best | ..................... | H01R 9/2408 |
| 2017/0188479 A1* | 6/2017 | Unger | ..................... | H01R 9/26 |
| 2020/0388959 A1* | 12/2020 | Furugoori | .......... | H01R 13/7032 |
| 2023/0074501 A1* | 3/2023 | Best | ..................... | H05K 7/1469 |

* cited by examiner

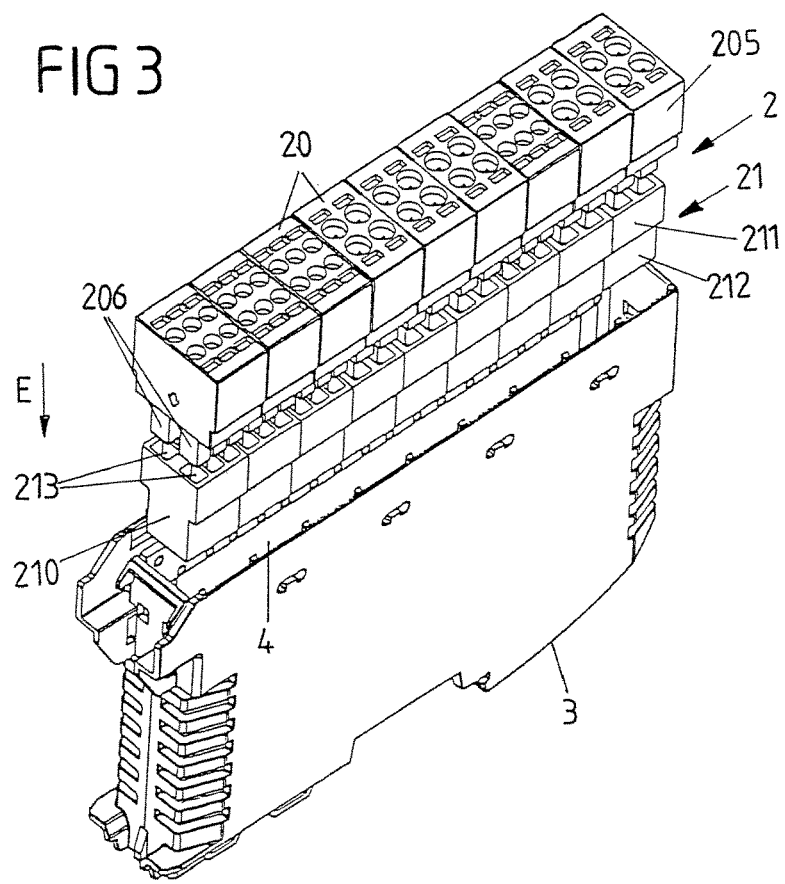
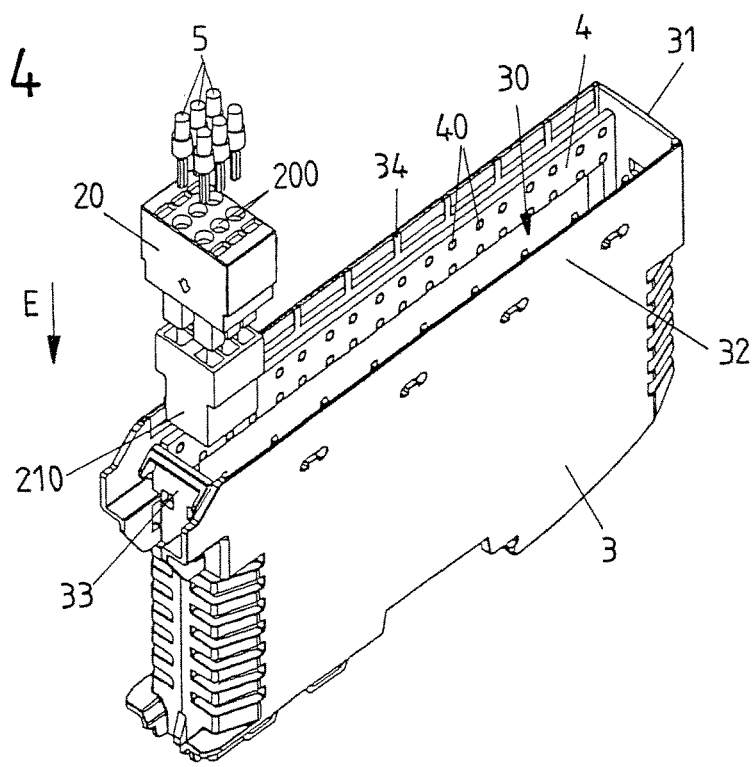

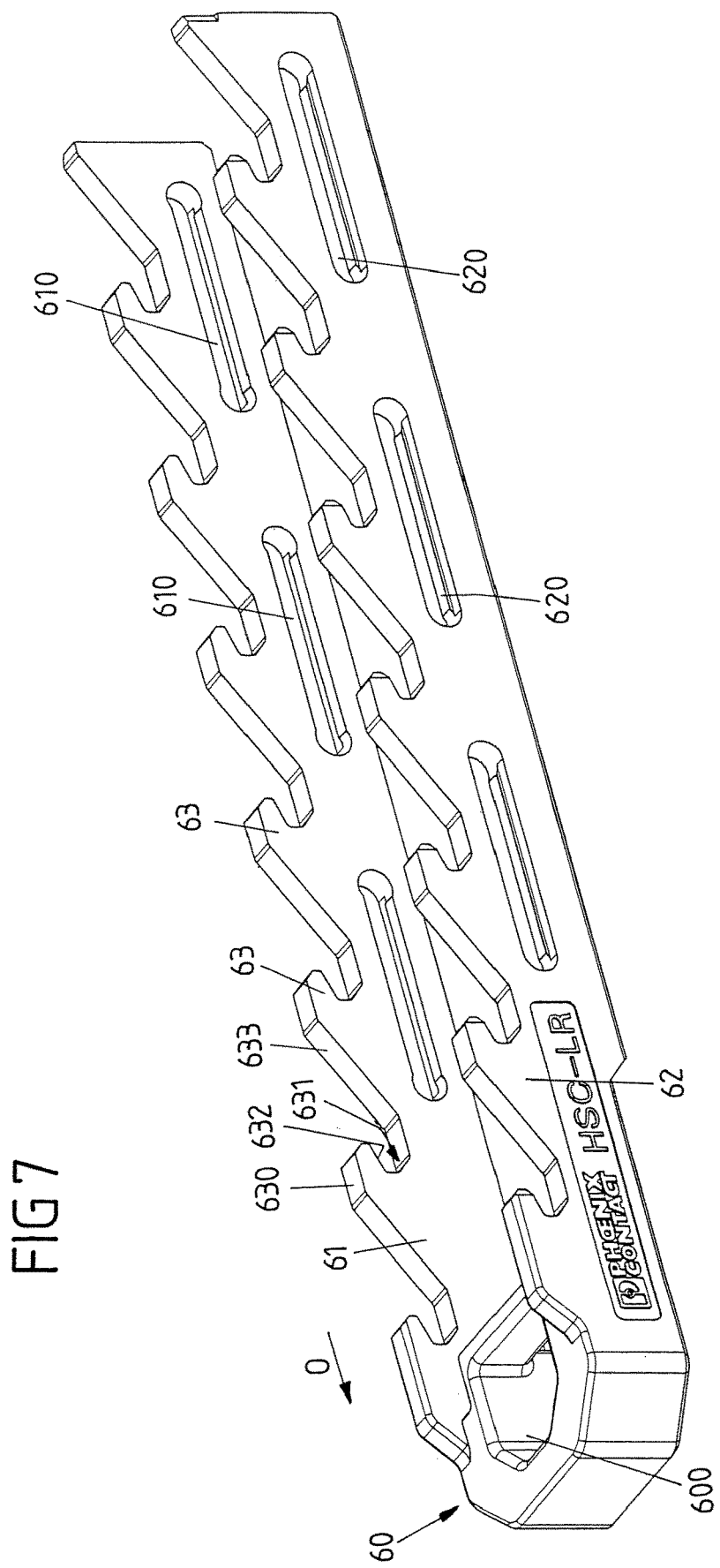

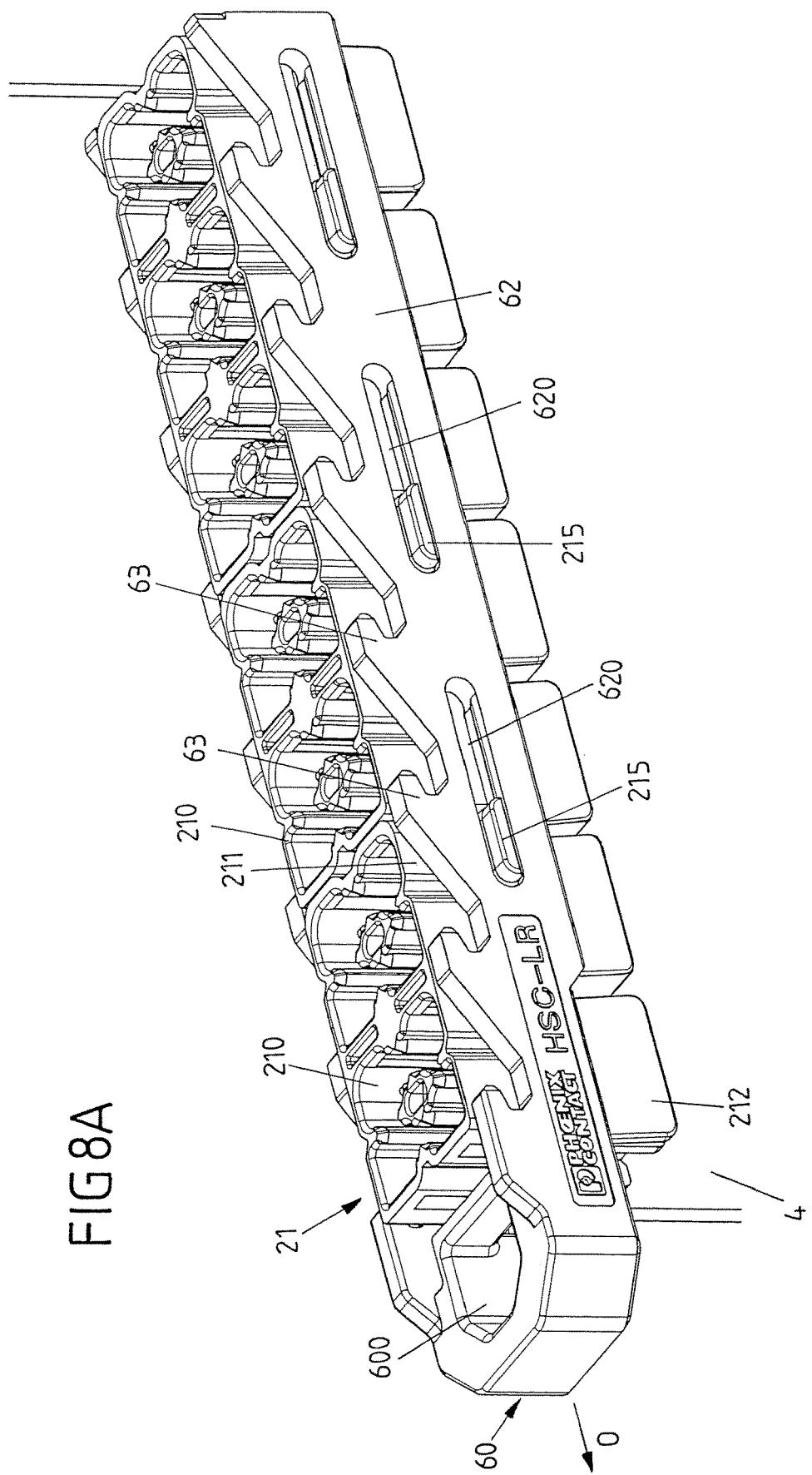

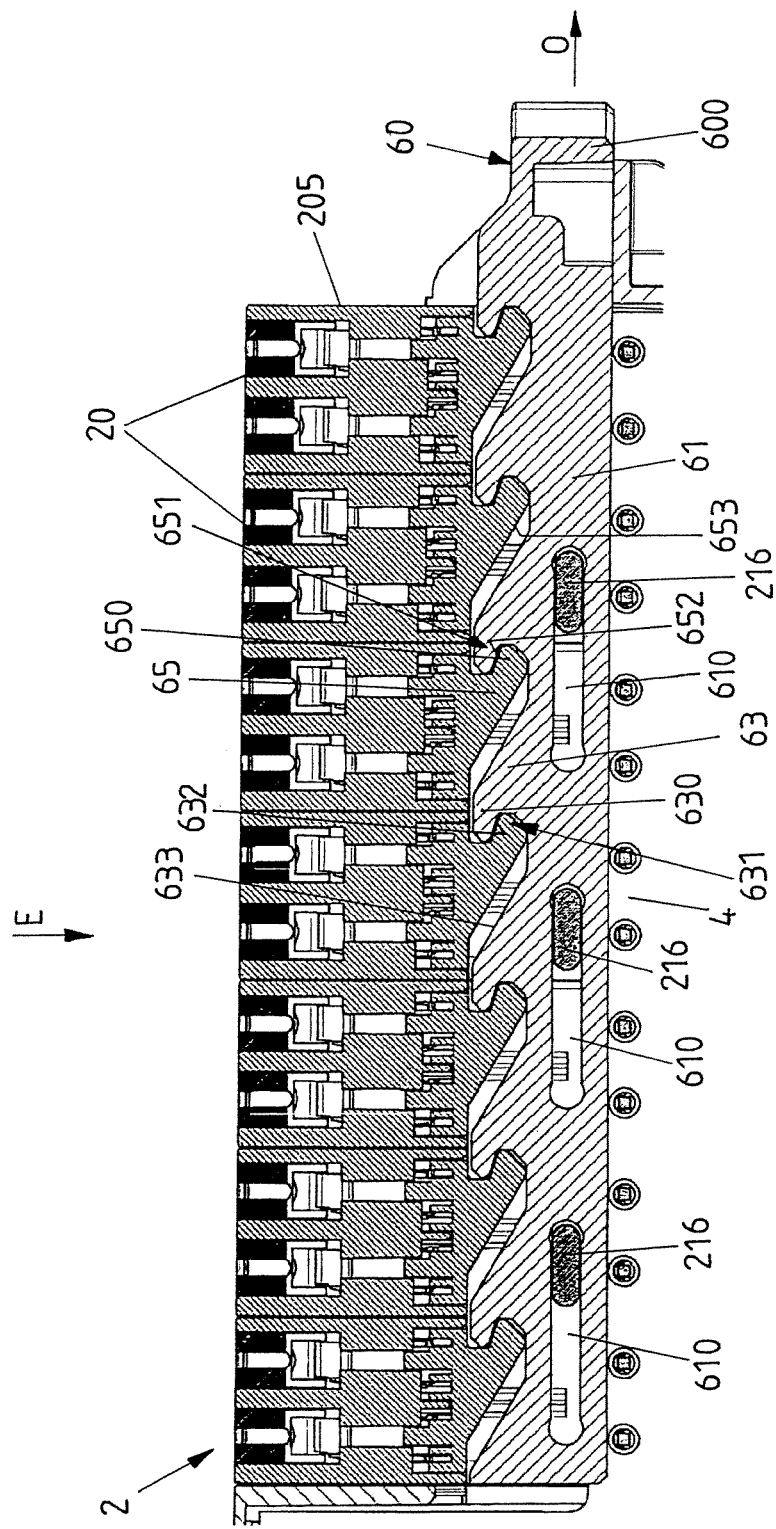

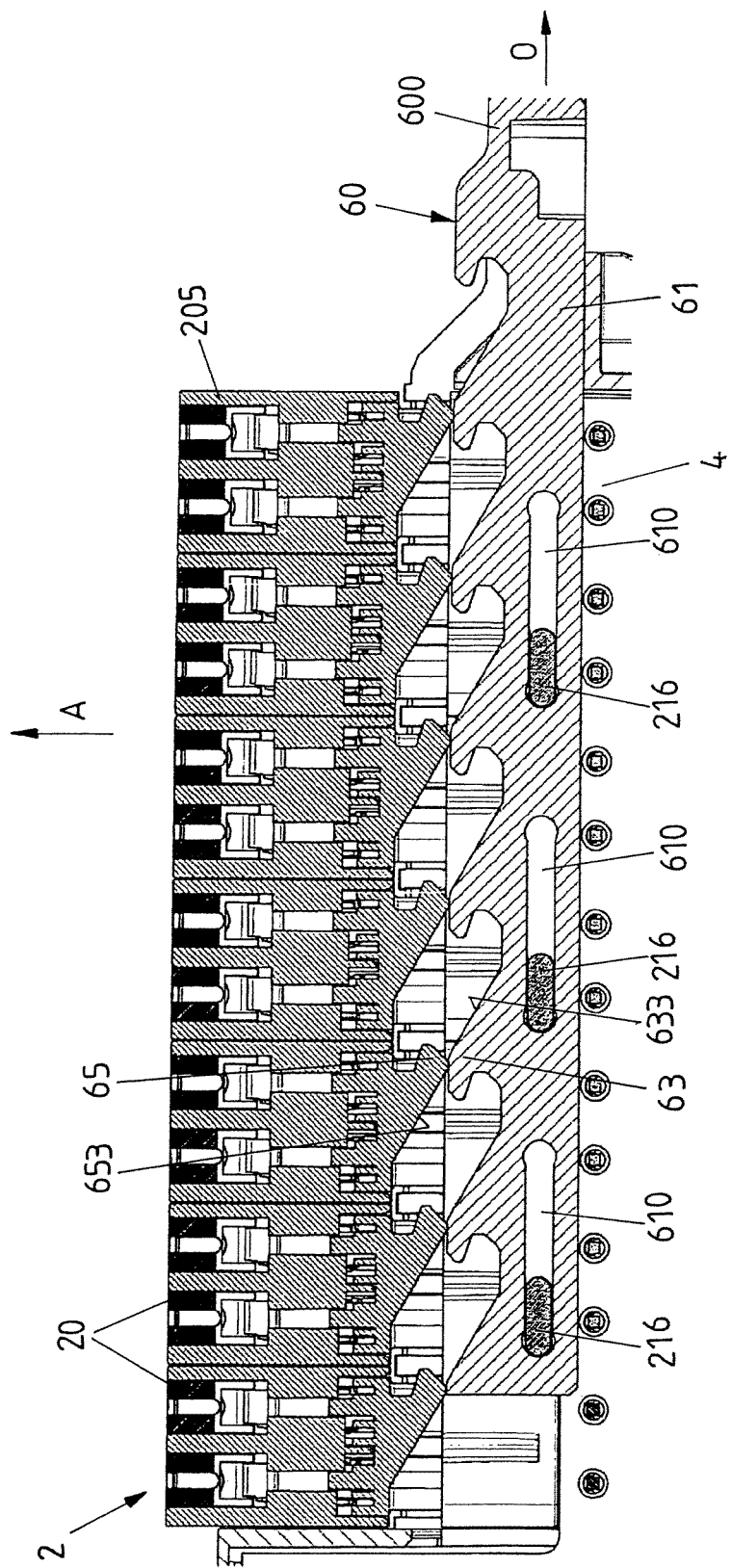

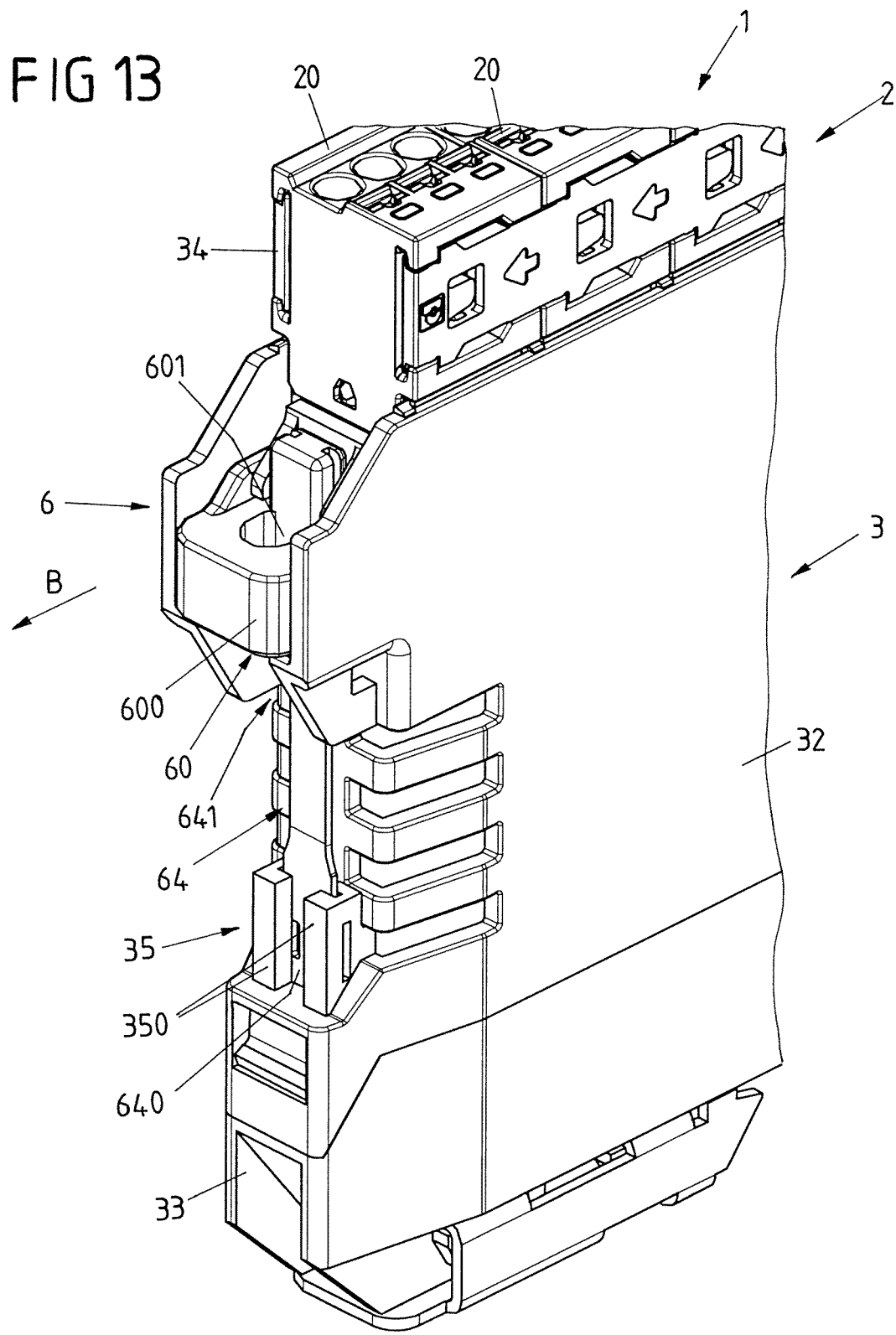

ASSEMBLY OF AN ELECTRONIC DEVICE HAVING AN ELECTRONICS HOUSING AND A BASE STRIP

CROSS-REFERENCE TO PRIOR APPLICATIONS

This application is a U.S. National Phase application under 35 U.S.C. § 371 of International Application No. PCT/EP2021/051100, filed on Jan. 20, 2021, and claims benefit to German Patent Application No. DE 10 2020 101 321.3, filed on Jan. 21, 2020. The International Application was published in German on Jul. 29, 2021 as WO/2021/148423 under PCT Article 21(2).

FIELD

The invention relates to an assembly of an electronic device.

BACKGROUND

Such an assembly of an electronic device comprises an electronics housing for accommodating an electronic component, a base strip that can be attached to the electronics housing and has a plurality of plug receptacles to which plug modules can be attached, and a locking apparatus for locking the plug modules to the plug receptacles of the base strip. The locking apparatus has an actuating part that can be moved in an actuating direction toward the electronics housing in order to remove the plug modules from the base strip.

Such an assembly of an electronic device is known from DE 10 2014 106 277 B4, for example.

By equipping the base strip, a terminal strip can be created on the electronic device, which terminal strip can be configured variably in order to connect electrical conductors to the electronic device. Such terminal strips are conventionally used on modular electronic devices in order to provide technology for connecting sensors and actuators, for example, to control electronics or the like. Such electronic devices are used, for example, in industrial plants, for example assembly systems, in conjunction with so-called fieldbus systems and can be attached to a mounting rail in a modular manner in order to be arranged in a compact manner, for example in a factory hall. For example, sensors from which sensor signals are obtained and actuators to which control signals are sent are connected to the terminal strip, wherein indicator elements for indicating system states or the like or operating elements for inputting a control command or for controlling state variables can additionally also be provided.

Due to the complexity and diversity of the demands on electronic devices, for example for assembly systems, electronic devices are usually developed and produced specifically for a particular use. In this case, a particular electronic device contains in a modular electronics housing an electronic component designed on the basis of the existing requirements in the form of a printed circuit board, to which is attached a terminal strip designed in a particular manner for connecting electrical single conductors or plugs to the electronic component. Since the requirements on the terminal strip are determined by the electronic component in this case, completely different terminal strips must be used for different electronic components. This makes the production of such terminal strips complex and diverse and thus increases their costs.

A plurality of plug modules for connecting, for example, a plurality of sensors, actuators or other elements to an electronic device can be inserted into a base strip, via which the terminal strip can be connected to an electronic component, for example a printed circuit board, enclosed in an electronics housing. In the completed state, a plurality of plug modules are inserted into the base strip of the terminal strip and connected via the base strip to an electronic component enclosed in the electronics housing.

In the case of such a base strip, the locking apparatus is provided in order to hold the plug modules in the completed state on the base strip. The actuating part of the locking apparatus can be actuated in order to release the locking of the plug modules to the base strip, so that the plug modules can be removed from the base strip. For this purpose, the actuating part can be moved in an actuating direction toward the electronics housing, so that locking is released by actuation and it thus becomes possible to remove the plug modules from the base strip.

In the electronic device known from DE 10 2014 106 277 B4, such an actuating part is spring-preloaded with respect to the base strip via a spring element in the form of a compression spring. The actuating part is guided on the base strip and is loaded in relation to the base strip during actuation, so that after actuation of the actuating part, the actuating part is autonomously returned to a starting position corresponding to a locked position.

In the case of such a base strip, there is a need for simple assembly and for simple handling for equipping the electronic device with plug modules and optionally for releasing the plug modules from an electronic device. Advantageously, assembly should be able to take place in an automatable manner.

SUMMARY

In an embodiment, the present invention provides an assembly of an electronic device, comprising: an electronics housing configured to accommodate an electronic component; a base strip attachable to the electronics housing and having a plurality of plug receptacles to which plug modules are attachable; and a locking apparatus configured to lock the plug modules to the plug receptacles of the base strip, wherein the locking apparatus has an actuating part movable in an actuating direction toward the electronics housing in order to remove the plug modules from the base strip, and wherein a spring element is arranged on the electronics housing and configured to preload the actuating part in relation to the electronics housing counter to the actuating direction.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 3 a view of an electronic device having an electronics housing and a terminal strip that is to be attached to the electronics housing and is composed of individual base housings;

FIG. 4 a view of the arrangement according to FIG. 3, but only with one base housing of the terminal strip;

FIG. 7 a separate view of an actuating part of the locking apparatus;

FIG. 8A, 8B views of the actuating part of the locking apparatus on the base strip of an electronic device;

FIG. 9A a sectional view along the line I-I according to FIG. 5, in a locked position of the actuating part of the locking apparatus;

FIG. 9C the view according to FIG. 9A, but with the actuating part in an unlocked position, in which the plug modules are unlocked from the base strip;

FIG. 13 a view of an end face of an electronic device comprising a spring element arranged thereon in the form of a leaf spring for preloading the actuating part of the locking apparatus in relation to the electronics housing

DETAILED DESCRIPTION

Figure 1:
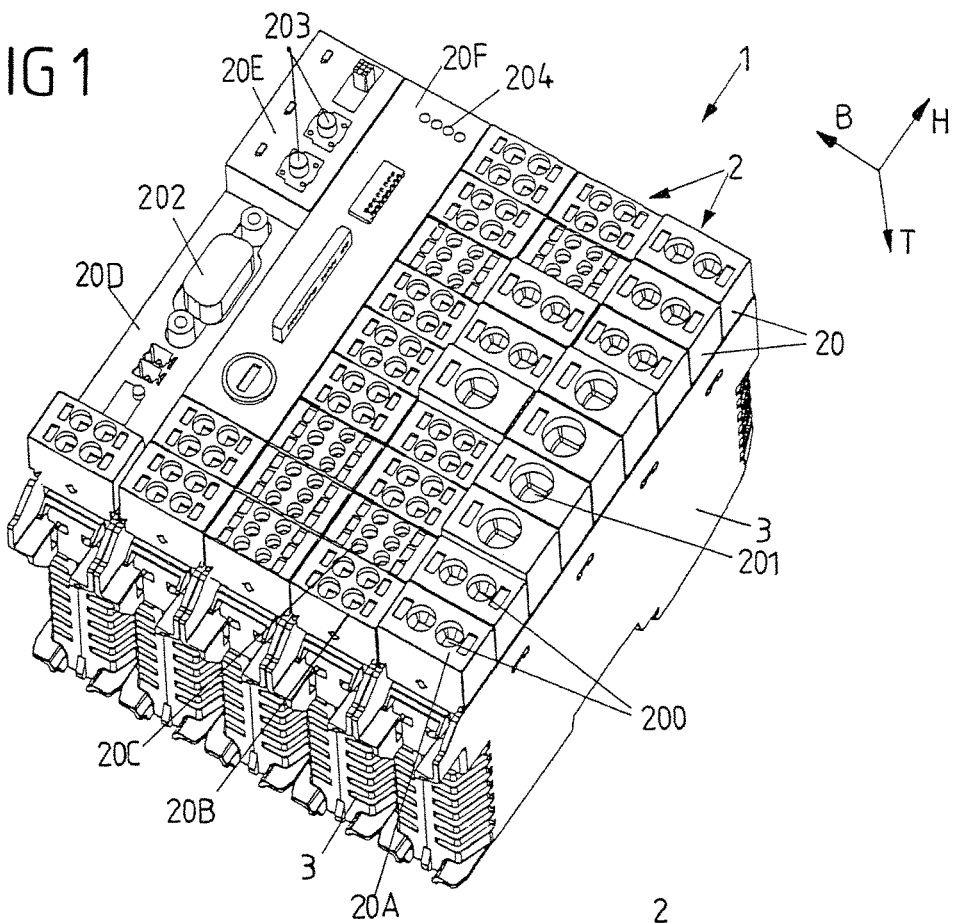
FIG. 1 a view of electronic devices to be attached to a mounting rail, each having an electronics housing and a terminal strip attached to the electronics housing.

In an embodiment, the present invention provides an assembly of an electronic device that enables simplified mounting of the electronic device with the possibility of simple, reliable handling of the actuating part of the locking apparatus.

Accordingly, the assembly has a spring element that is arranged on the electronics housing and designed to preload the actuating part in relation to the electronics housing counter to the actuating direction.

Whereas the solution of DE 10 2014 106 277 B4 provides spring preloading of the actuating part in relation to the base strip by a compression spring being supported on the base strip, the actuating part in the present solution is preloaded via a spring element in relation to the electronics housing. The locking apparatus serves to lock plug modules that are attached to the plug receptacles of the base strip to the base strip. The locking can be produced via the actuating part, in particular via locking elements arranged on the actuating part, wherein the actuating part can be actuated in order to release the locking and thus remove the plug modules from the base strip. The actuating part is actuated in the actuating direction toward the electronics housing, wherein, upon actuation, the spring element arranged on the electronics housing is loaded and the adjustment of the actuating part thus takes place counter to the spring preloading of the spring element. Due to the spring preloading, the actuating part is autonomously returned to a starting position corresponding to the locked position after actuation has taken place, so that plug modules that are attached to the base strip can again lock to the base strip.

In that the spring element brings about a preloading between the electronics housing and the actuating part, preassembly of the spring element becomes possible. Thus, the spring element can be mounted for preassembly on the electronics housing or the actuating part and the electronics housing (before being equipped with the base strip) or the actuating part can be delivered together with the spring element arranged thereon within the framework of an assembly set. The possibility arises for simplified, automatable manufacturing, with which in particular the spring element can be arranged on the electronics housing or on the actuating part in a simple preassemblable manner.

In one embodiment, the spring element can be designed, for example, as a wire spring. The spring element is manufactured, for example, from a spring steel and extends in the shape of a plate, wherein the spring element can be elastically deformed in order to bring about a preloading between the electronics housing and the actuating part.

In one embodiment, the spring element is arranged with a first end on the electronics housing and is operatively connected to a second end to the actuating part. In this case, the spring element can be preassembled on the actuating part or on the electronics housing. In the mounted position, the spring element is connected to the first end to the electronics housing and interacts, with the second end, with the actuating part, so that when the actuating part is adjusted in the actuating direction, the spring element is loaded and a restoring force is thus exerted on the actuating part.

In one embodiment, the actuating part has a handle that can be actuated by a user, forms an opening and, when the electronic device has been mounted, comes to lie, for example, outside the electronics housing, thus providing an engagement point for a user for actuation. A user can engage in the opening, for example, with a tool, for example a screwdriver, in order to actuate the actuating part. In one embodiment, the spring element engages with the second end in the opening of the handle and is thus operatively connected to the actuating part by this engagement.

The spring element can be fixedly connected to the second end to the actuating part. However, it is also conceivable for the spring element at the second end to be loosely supported with respect to the actuating part, for example by the spring element only coming into interactive abutment with the actuating part upon actuation.

In one embodiment, the spring element is arranged on a narrow end face, extending perpendicularly to the actuating direction, of the electronics housing. The longitudinally extending actuating part can be moved perpendicularly to the end face, in order to bring about unlocking of the locking apparatus in order to remove the plug modules from the base strip, wherein upon actuation, the spring element is deflected and thus loaded in order to bring about a restoring force on the spring element to the starting position corresponding to the locked position.

The actuating part is designed, for example, as an actuating slide guided displaceably along the actuating direction on the base strip or on the electronics housing. Preferably, the plug modules are jointly locked via the actuating part to the base strip in the locked position of the locking apparatus, so that the plug modules cannot easily be removed from the base strip, in any case not unintentionally. The actuating part can be actuated by moving in the actuating direction, so that when the actuating part is actuated, the locking of the plug modules to the base strip is jointly released and the plug modules can thus be removed from the base strip.

In one embodiment, the actuating part has a plurality of locking elements that are designed to be in locking engagement in a locked position with counter elements of the plug modules in such a way that the plug modules are locked relative to the base strip counter to the insertion direction. The locking elements of the actuating part are preferably spaced apart from one another along the actuating direction. Each plug module has, for example, at least one counter element that is in locking engagement in the locked position with an assigned locking element of the actuating part. The plug modules can be attached to the base strip in a row, for example along the actuating direction, corresponding to an alignment direction along which the base strip extends, so that a plug module with its counter element is connected to a locking element of the actuating part, and an adjacent plug module with its counter element is in engagement with a different locking element, spaced apart along the actuating direction, of the actuating part.

In the unlocked position of the actuating part, the locking of the plug modules to the base strip is released, so that a user can easily release one or more plug modules from the base strip.

The actuating part has two arms, for example, which each carry a plurality of locking elements. In this way, the actuating part can, for example, be U-shaped, wherein the arms of the actuating part form legs of a "U" and the arms are connected to one another via an actuating portion that a user can grasp, for example, with a suitable tool in order to actuate the actuating part.

The arms preferably extend in parallel to one another along the actuating direction and are advantageously arranged in relation to the base strip in such a way that they extend on both sides of the base strip and thus accommodate between them the base strip. The U-shaped actuating part thus surrounds the base strip and can be moved longitudinally along the actuating direction relative to the base strip.

The actuating part is preferably guided longitudinally along the actuating direction on the base strip via the arms, wherein the guide can be provided, for example, by the engagement of one or more pins in one or more elongated holes. For example, the arms of the actuating part can each have one or more elongated holes that extend along the actuating direction and in which one or more pins of the base strip engage, so that a guide of the arms on the base strip is provided in the manner of a slotted guide. In that the actuating part is guided on the base strip but not on an electronics housing to which the base strip is attached, the actuating part is independent of the housing and its tolerances. The actuating part is in particular exclusively supported on the base strip but not on the electronics housing.

The arms of the actuating part each preferably carry a plurality of locking elements. In one embodiment, the locking elements of the arms can be opposite on another in pairs as viewed along a transverse direction transverse to the actuating direction. The arms are spaced apart from one another along the transverse direction. In that the locking elements of the arms are opposite one another in pairs, each locking element of the one arm is assigned a different locking element of the other arm, which are positioned axially at the same position as viewed along the actuating direction. A pair of counter elements of a plug module is preferably assigned to this pair of locking elements, so that in the locked position, the pair of locking elements is in locking engagement with the pair of counter elements of the assigned plug module and a secure, reliable hold of the plug module on the base strip is provided in this way.

By means of the actuating part, locking of the plug modules in relation to the base strip in the locked position can be brought about on the one hand and joint actuation for unlocking the plug modules from the base strip can be enabled on the other hand. Additionally, it can be provided that, when the actuating part is actuated, the ejection of the plug modules from the base strip counter to the insertion direction is also supported in that a suitable ejection apparatus is provided on the actuating part or on the plug modules. For example, the locking elements of the actuating part and/or the counter elements of the plug modules can each have an ejection bevel that extends obliquely to the insertion direction and onto which the respective other element runs when the actuating part is actuated in the actuating direction, so that an ejection force on the plug modules counter to the insertion direction is brought about.

The base strip preferably extends along an alignment direction. In the inserted position, the plug modules are arranged in a row along the alignment direction and inserted into assigned plug receptacle of the base strips, so that an arrangement of plug modules longitudinally adjoining one another results. In this case, the base strip can be composed, for example, of a plurality of base strip modules that are attached to one another along the alignment direction in order to form the base strips and are fixedly connected to one another, for example by gluing, welding or also by suitable positive-locking elements.

In this case, it can be provided that exactly one plug module can be attached to each base strip module. However, it is also conceivable and possible that, for example, a plurality of plug modules can be attached to a base strip module or that a plug module is to be attached to a plurality of base strip modules.

A connection to an electronic component enclosed in the electronics housing is established via the base strip. For this purpose, the base strip can be connected to the electronic component, wherein, for example, a predetermined number of electrical single conductors or plugs can be connected to the plug modules. For this purpose, the plug modules can have, for example, contact receptacles for attaching single conductors, wherein each plug module can comprise a plurality of contact receptacles for attaching a plurality of single conductors.

An electronic device comprises an electronics housing in which an electronic component, for example a printed circuit board, is enclosed. The base strip is connected to the electronic component in that the base strip is, for example, attached to the printed circuit board and is electrically contacted with conductor tracks of the printed circuit board by means of suitable solder connections or the like.

Figure 2:
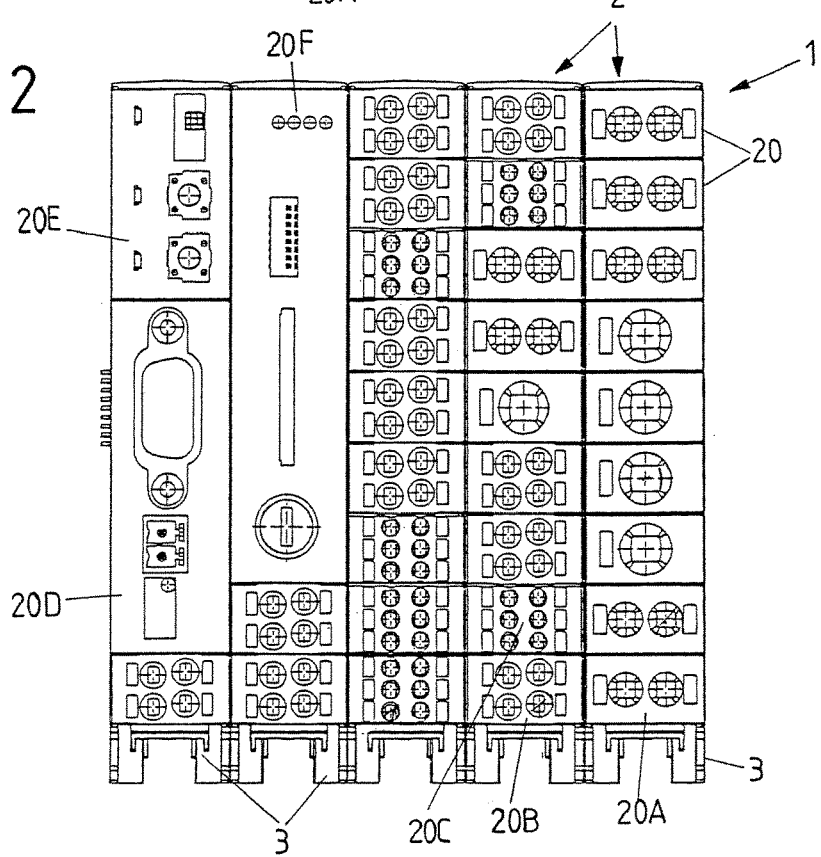
FIG. 2 the arrangement according to FIG. 1, from above.

FIGS. 1 and 2 show an arrangement of electronic devices 1, which together form a connection apparatus and are each formed from an electronics housing 3 and a terminal strip 2 along with an electronic component accommodated in the electronics housing 3 in the form of a printed circuit board. The electronics housings 3 of the electronic devices 1 are arranged in a row along a width direction B and can be attached to a common mounting rail in a manner known per se, so that a compact electronic apparatus with modular individual electronic devices 1 is created.

The terminal strip 2 of each electronics housing 3 extends longitudinally on the assigned electronics housing 3 along an alignment direction H. The terminal strips 2 are arranged along a depth direction T above the electronics housings 3 and project outward from the electronics housings 3 along the depth direction T.

The terminal strips 2 create an interface for connecting electrical single conductors or plugs to the electronic components accommodated in the electronics housings 3. For this purpose, the terminal strips 2 have a plurality of contact receptacles 200 in which contacts 201 are arranged and which, for example, realize clamping units for connecting electrical single conductors. In addition, plug connector parts 202, adjusting elements 203 or indicator elements 204 are provided on individual terminal strips 2. A compatible plug can be connected to a plug connector part 202. Via adjusting elements 203, a regulation, for example for adjusting a potentiometer, can be carried out, for example. Moreover, via indicator elements 204, a system state can be indicated, for example.

The configuration of the individual terminal strips 2 depends on the electronic components accommodated in the electronics housings 3. Depending on which function the electronic components accommodated in the electronics housings 3 fulfill, different lines or plugs of different external units can be connected to the connection parts 2.

For example, such connection apparatuses 1 can be used in industrial plants with which, for example, sensors and actuators are to be connected to superordinate control devices. The control devices are realized by the electronic components accommodated in the electronics housings 3 and receive sensor signals from sensors, which are connected via the terminal strips 2, and send control signals to actuators, which are likewise connected via the terminal strips 2.

In the electronic devices 1, the terminal strips 2 are each composed of different base strips 21 with base strip modules 210 and plug modules 20, 20A-20F attached thereto. In this case, the base strip modules 210 are attached to one another along an alignment direction H in order to form a terminal strip 2, and different plug modules 20, 20A-20F are attached to the base strip modules 210. The plug modules 20, 20A-20F have, for example, different numbers of contact receptacles 200 and of contacts 201 arranged thereon. The plug modules 20, 20A-20F can differ in the number of contact receptacles, in the size of the contact receptacles, in the shape of the contact receptacles, in the number of contacts arranged in the contact receptacles, in the size or shape of the contacts, in the arrangement of the contacts or the like. In addition, a plug module 20, 20A-20F can also realize a different function than the connection of electrical single conductors or plugs and can serve, for example, as an operating element or as an indicator element.

In the exemplary embodiment shown in FIGS. 1 and 2, the plug module 20A has two contact receptacles 200, for example, which can be designed to connect two electrical single conductors in the manner of clamping units, for example spring terminals. In contrast, the plug module 20B has four contact receptacles 200, whose diameter is smaller than that of the two contact receptacles 200 of the plug module 20A. The plug module 20C in turn has six contact receptacles 200, whose diameter is smaller than that of the contact receptacles 200 of the plug module 20B and of the plug module 20A. Another plug module 20D has a plug connector part 202 in the manner of a D-sub connector. Yet another plug module 20E realizes an operating element with two adjusting elements 203 arranged thereon in the manner of rotary knobs. Moreover, a plug module 20F realizes an indicator element with an indicator unit arranged thereon in the form of light-emitting diodes.

As can be seen in FIGS. 1 and 2, different contact receptacles 200 and contacts 201 of different plug modules 20, 20A-20C can be designed differently. The contact receptacles 200 can thus have different diameters, or contacts 201 of different plug modules 20, 20A-20F can have different distances from one another. Contact receptacles 200 with a large diameter can be designed here for accommodating single conductors with a large diameter and accordingly a large current-carrying capacity, while small contact receptacles 200 serve to accommodate conductors with a small diameter and accordingly small current-carrying capacity.

FIGS. 3 and 4 show an electronics housing 3 with an electronic component 4 arranged thereon in the form of a printed circuit board, which has contact openings 40 for connecting base strip modules 210 of the base strip 21 of an assigned terminal strip 2. The electronics housing 3 is formed from two side walls 32, 34, which are connected to one another via end walls 31, 33 and form a box for enclosing the electronic component 4 in the form of the printed circuit board.

For assembly, a base strip 21 is first assembled from a combination of base strip modules 210 and connected via the contact openings 40 to the electronic component 4 in the form of the printed circuit board. The base strip 21 can then be inserted together with the electronic component 4 in an insertion direction E, corresponding to the depth direction T, into an insertion opening 30 of the electronics housing 3, so that the electronic component 4 and the base strip 21 formed from the base strip modules 210 come to lie inside the electronics housing 3. Assigned plug modules 20 can then be inserted in the insertion direction E into the individual base strip modules 210, so that the electronic device 1 is completed in the inserted state and, in this exemplary embodiment, electrical single conductors 5 can be connected to the terminal strip 2.

Figure 5:
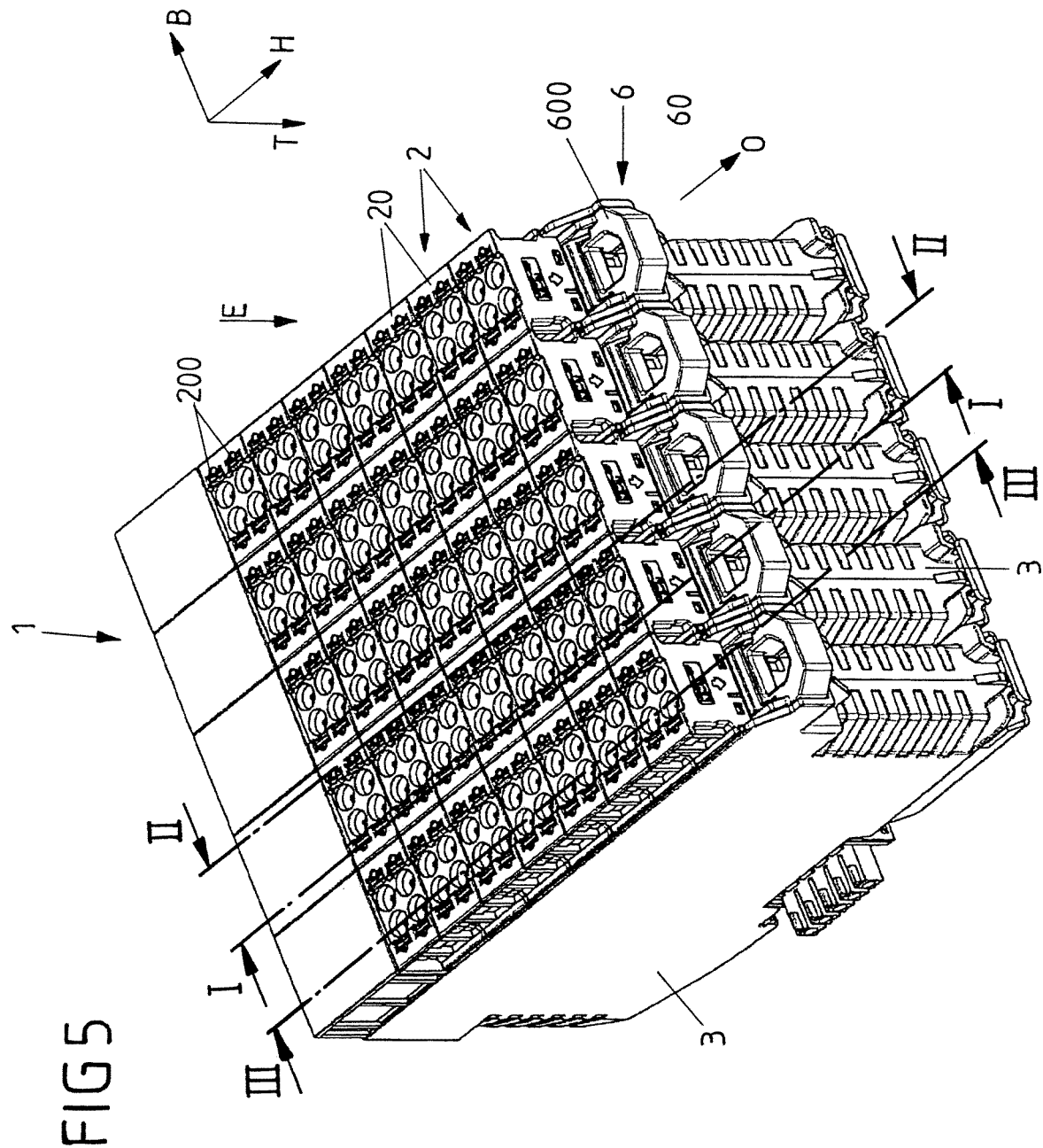
FIG. 5 a view of another arrangement of electronic devices to be attached to a mounting rail, each having an electronics housing and a terminal strip attached to the electronics housing, along with a locking apparatus for locking plug modules to a base strip.

FIG. 5 shows another arrangement of electronic devices 1, each having an electronics housing 3 and a terminal strip 2 attached thereto. With regard to their modular construction, the electronic devices 1 according to FIG. 5 are functionally identical to the electronic devices 1 described above with reference to FIGS. 1 to 4 and have terminal strips 2, each having a plurality of plug modules 20, which are attached to base strips 21 formed from base strip modules 210 and are held on the base strips 21 in an inserted state, shown in FIG. 5.

Each electronic device 1 has a locking apparatus 6, which comprises an actuating part 60 in the form of an actuating slide that can be displaced longitudinally along an actuating direction O and serves to lock the plug modules 20 in a locked position to the base strip 21, so that the plug modules 20 cannot be easily removed from the base strip 21, in any case not unintentionally.

Figure 6:
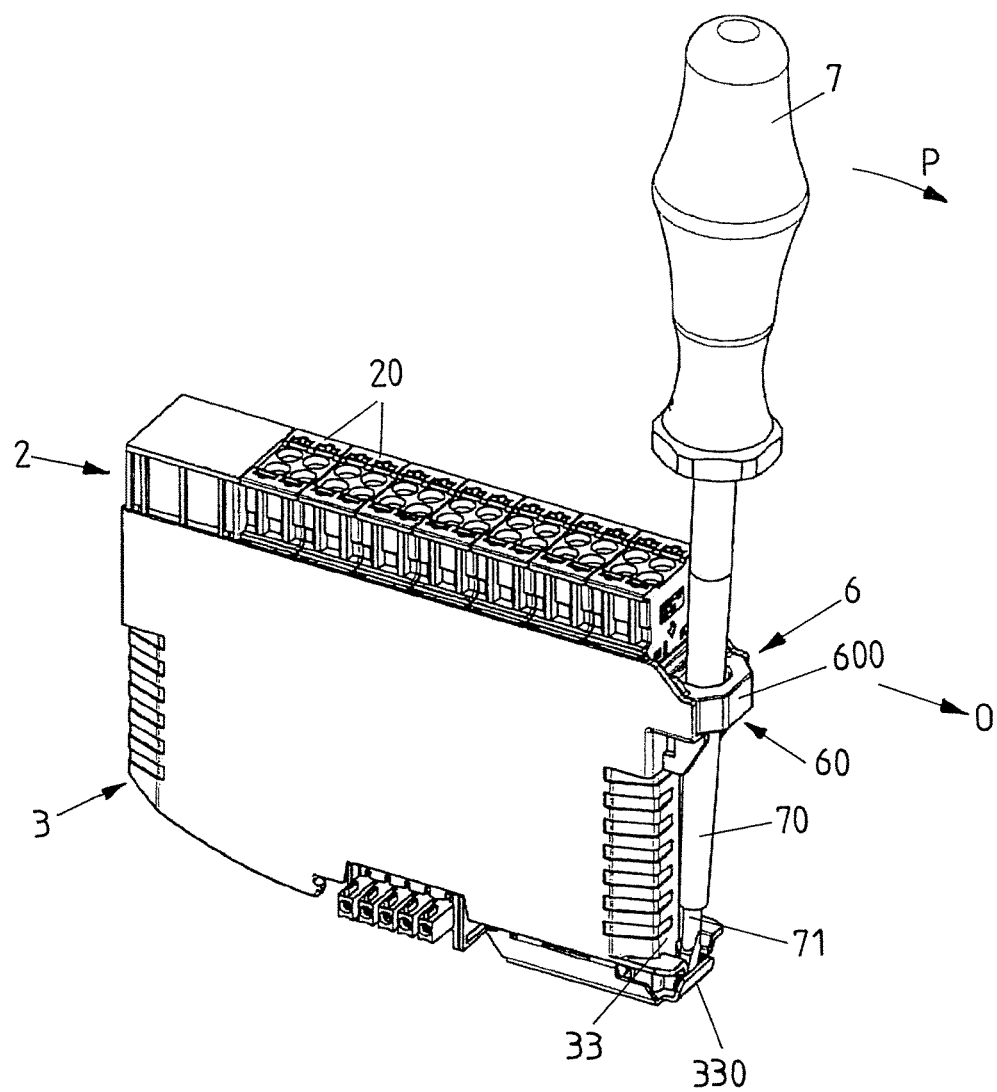
FIG. 6 a view of an electronic device when the locking apparatus is actuated in order to unlock the plug modules from the base strip.

The actuating part 60 is guided longitudinally on an assigned base strip 21 of a terminal strip 2 along the actuating direction O. By using a tool 7, shown in FIG. 6, the actuating part 60 can be actuated in the actuating direction O by attaching the tool 7, for example a screwdriver, to a tool shank 70 on an actuating portion 600 of the actuating part 60 and inserting it with a shank tip 71 into an engagement opening 330 in the end face 33 of the electronics housing 3, so that a displacement of the actuating part 60 in the actuating direction O can be brought about by tilting the tool 7 in the direction of arrow P.

Figure 8B:
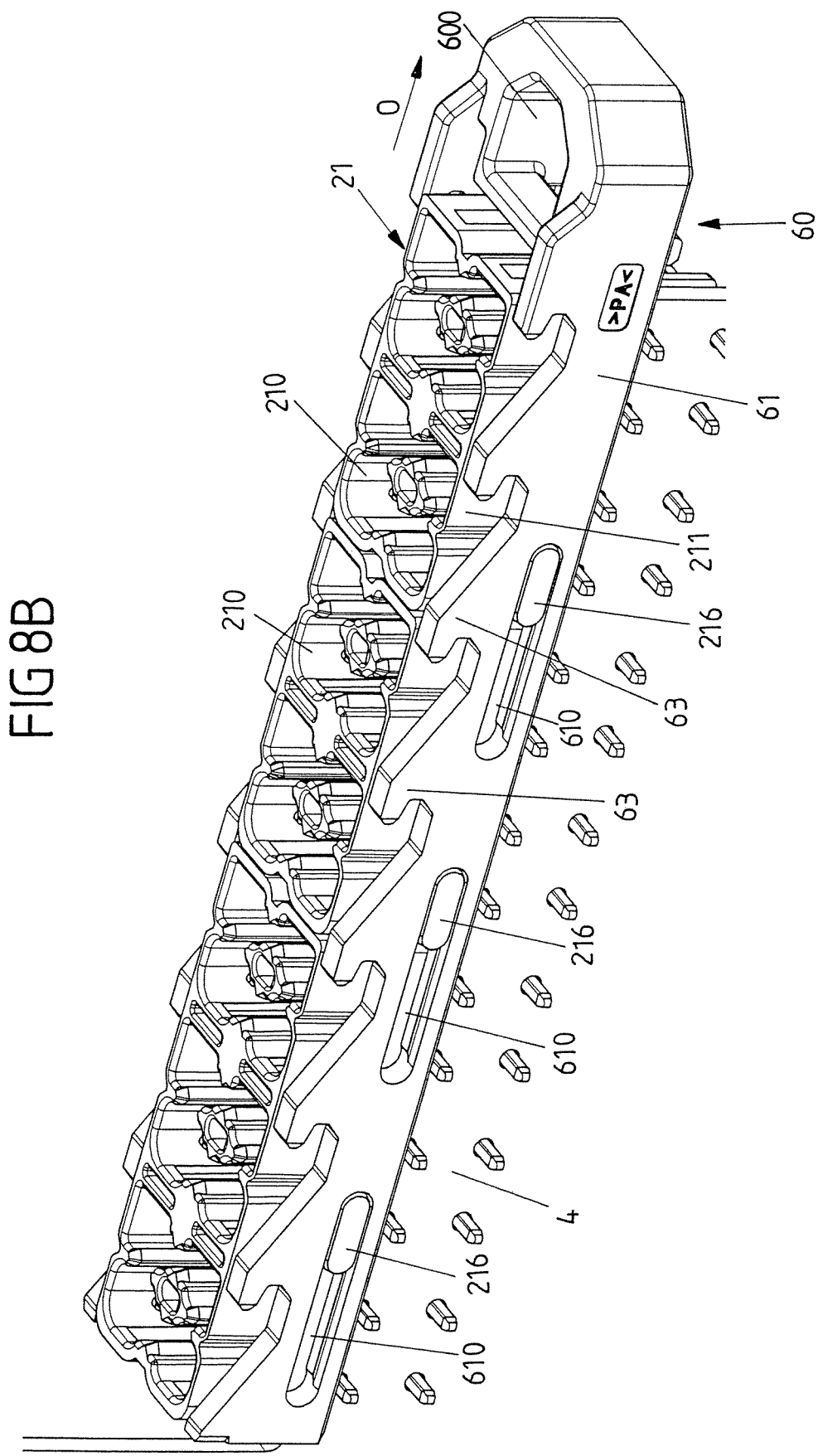

As can be seen in the views according to FIGS. 7 and 8A, 8B, the actuating part 60 is produced, for example, as a plastic molded part and has a U-shape. The actuating part 60 thus comprises two arms 61, 62, which adjoin the actuating portion 600 and are connected to one another via the actuating portion 600. The arms 61, 62 longitudinally extend in parallel to one another along the actuating direction O and each carry a plurality of locking elements 63 in the form of locking hooks, which are arranged at a distance from one another along the actuating direction O on the arms 61, 62.

In this case, the locking elements 63 are arranged on the arms 61, 62 of the actuating part 60 in such a way that the locking elements 63 are opposite one another in pairs along a transverse direction transverse to the actuating direction O. Thus, a locking element 63 of an arm 61 is assigned a locking element 63 of the other arm 62, which locking element, as viewed along the actuating direction O, is arranged axially at the same position on the other arm 62.

Via the arms 61, 62, the actuating part 60 is guided longitudinally displaceably along the actuating direction O on the assigned base strip 21 of the terminal strip 2. For this purpose, a plurality of elongated holes 610, 620 spaced apart from one another along the actuating direction O are formed on each arm 61, 62 of the actuating part 60, pins 215, 216 arranged at the heads 211 of the base strip modules 210 of the base strip 21 engaging in said elongated holes and in this way providing a longitudinal guide in the manner of a slotted guide.

The adjustment path of the actuating part 60 along the actuating direction O is also predefined at the same time via the length of the elongated holes 610, 620 along the actuating direction O. In a locked position, the pins 215, 216 of the base strip 21 are located at a front end, facing the actuating portion 600, of the elongated holes 610, 620, as shown in FIGS. 8A and 8B. For unlocking, the actuating part 60 is displaced in the actuating direction O, so that the pins 215, 216 are moved in the assigned elongated holes 610, 620 and thus are displaced toward the other end of the elongated holes 610, 620.

As can be seen in FIGS. 8A and 8B, the base strip 21 is arranged with its base strip modules 210 between the arms 61, 62 of the actuating part 60, so that the arms 61, 62 accommodate the base strips 21 between them. A guide of the actuating part 60 on both sides of the base strip 21 is provided via the arms 61, 62.

Figure 11:
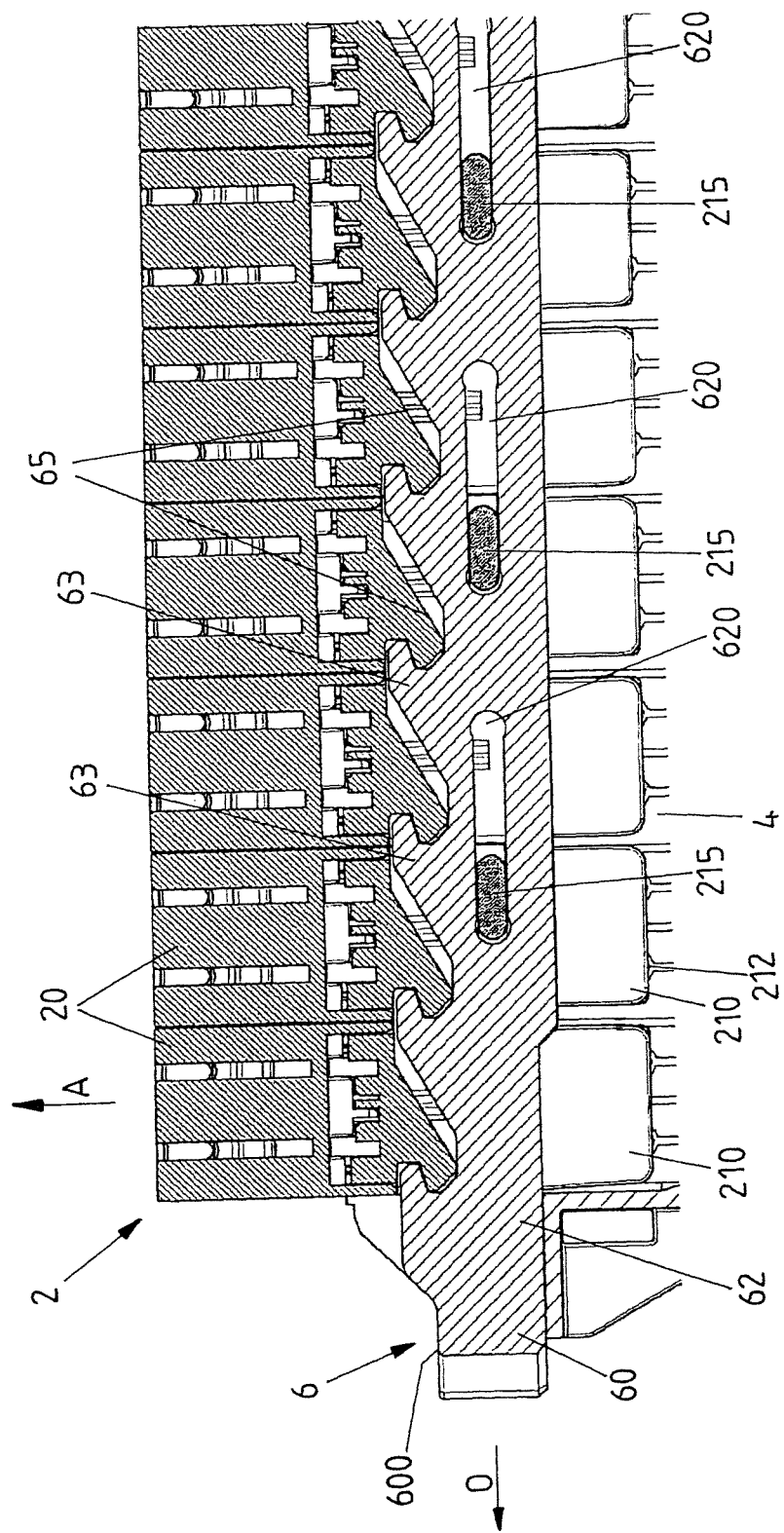
FIG. 11 a sectional view along the line II-II according to FIG. 5.
Figure 12:
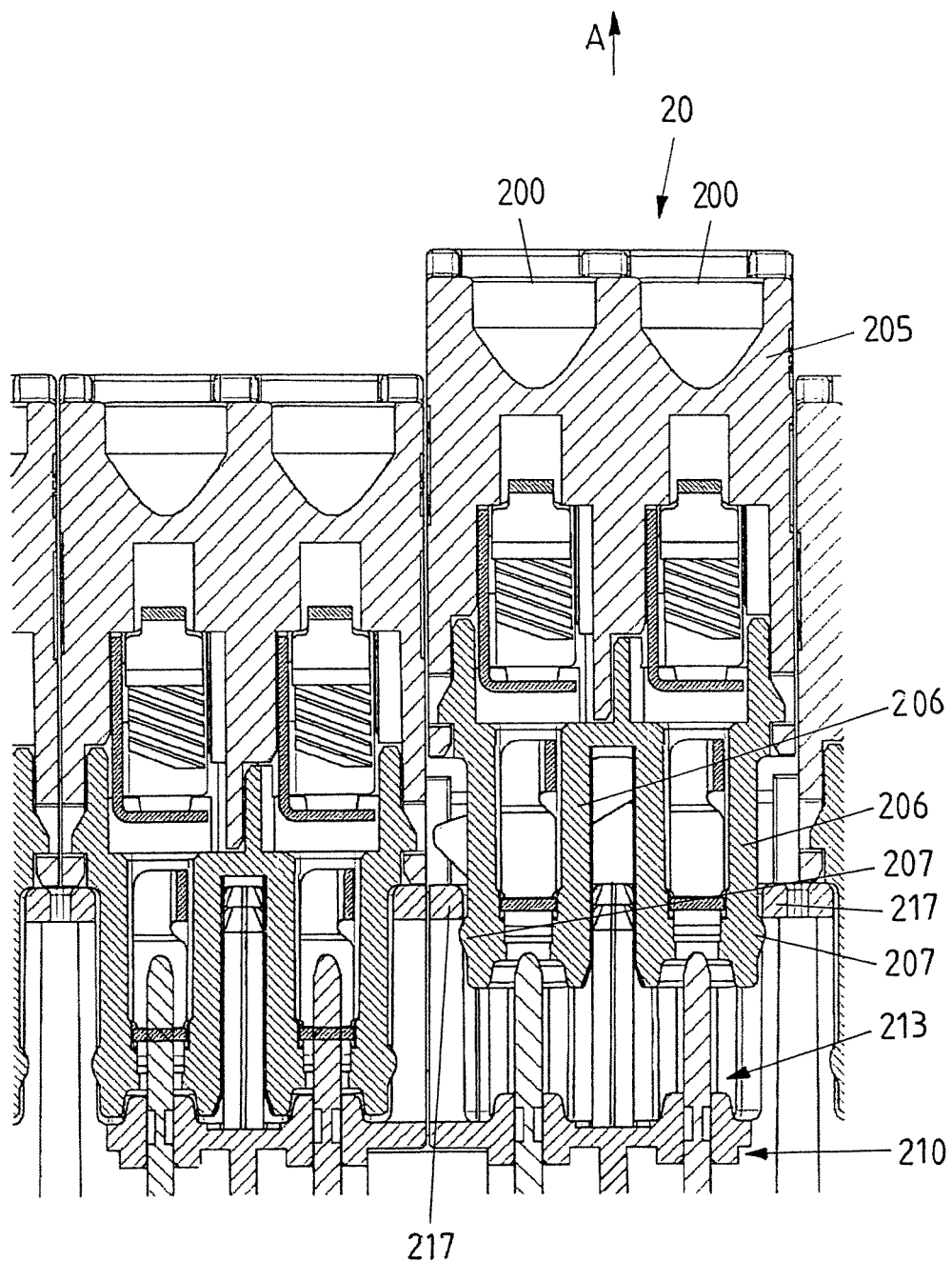
FIG. 12 a sectional view along the line according to FIG. 5, illustrating an ejection securing means for securing a plug module to prevent it from falling out after ejection by actuation of the actuating part.

The locking elements 63 on the arms 61, 62 of the actuating part 60 form pairs of locking elements 63 that are offset from one another along the actuating direction O and are in engagement with assigned pairs of counter elements 65 of the plug modules 20 in the locked position of the actuating part 60 and when plug modules 20 are attached, as can be seen in FIGS. 9A and 11.

FIG. 9A shows a sectional view along the line I-I with a view of the arm 61 of the actuating part 60 and its locking elements 63 in engagement with assigned counter elements 65 of the plug modules 20. FIG. 11, on the other hand, shows a sectional view along the line II-II with the opposite viewing direction of the arm 62 of the actuating part 60 with locking elements 63 arranged thereon in engagement with the assigned other counter elements 65 of the plug modules 20. As can be seen in FIGS. 9A and 11, a pair of counter elements 65 of a plug module 20 is assigned to each pair of locking elements 63 in the illustrated exemplary embodiment. In the locked position of the actuating part 60, corresponding to the position according to FIGS. 9A and 11, the locking elements 63 of the actuating part 60 are in positive engagement with the counter elements 65 of the plug modules 20, so that the plug modules 20 are held on the base strip 21 counter to the insertion direction E, in which the plug modules 20 are attached to the base strip 21.

As can be seen in FIG. 7 in conjunction with FIGS. 9A and 11, the locking elements 63 on the arms 61, 62 of the actuating part 60 and the counter elements 65 of the plug modules 20 each have a head 630, 650 that, in the locked position, engages in an assigned engagement opening 631, 651 of the respective other element 65, 63, so that a positive fit between the plug modules 20 and the actuating part 60 is established in the locked position. The hook-shaped locking elements 63 thus are in positive engagement with the likewise hook-shaped counter elements 65, so that the plug modules 20 are thereby held on the actuating part 60 counter to the insertion direction E.

Figure 10:
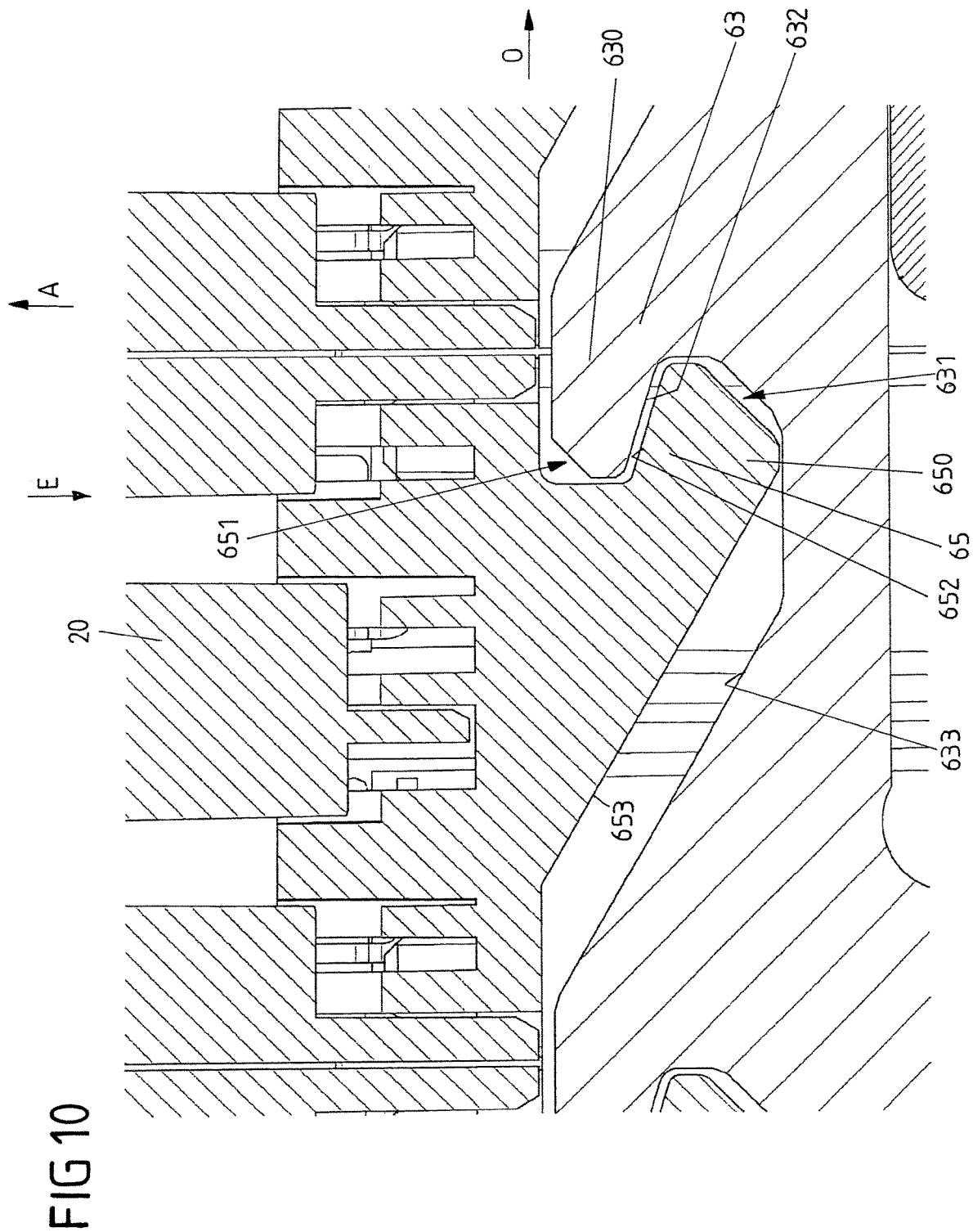
FIG. 10 an enlarged view of a locking element of the actuating part in engagement with a counter element of a plug module.

As can be seen in the enlarged view according to FIG. 10, illustrating a locking element 63 in cooperation with an assigned counter element 65, the heads 630, 650 of the locking element 63 on the one hand and the counter element 65 on the other hand each have an unlocking bevel 632, 652 on a side facing the respective other head, said unlocking bevels facing one another and being in abutment with one another in the locked position. The unlocking bevels 632, 652 are each inclined toward the insertion direction E in such a way that, when a plug module 20 is pulled in an ejection direction A opposite the insertion direction E, the unlocking bevels 632, 652 run onto one another. The inclination of the unlocking bevels 632, 652 is not self-locking in this case. When the plug module 20 is manually pulled in the ejection direction A, the unlocking bevels 632, 652 thus slide along one another, so that a force on the actuating part 60 in the actuating direction O is brought about and the locking between the plug modules 20 and the actuating part 60 can thus be released by pulling the plug module 20 in the ejection direction A.

A plug module 20 can thus be released from the base strip 21 by manually pulling it in the ejection direction O, wherein the locking is released in an autonomous, non-destructive manner via the actuating part 60, without a separate actuation of the actuating part 60 being required for this purpose.

An ejection bevel 633, 653 is arranged on a rear, facing away from the head 630, 650, of each hook-shaped locking element 63 or counter element 65 and serves to bring about ejection of the plug modules 20 from the base strip 21 when the actuating part 60 is actuated.

Figure 9B:
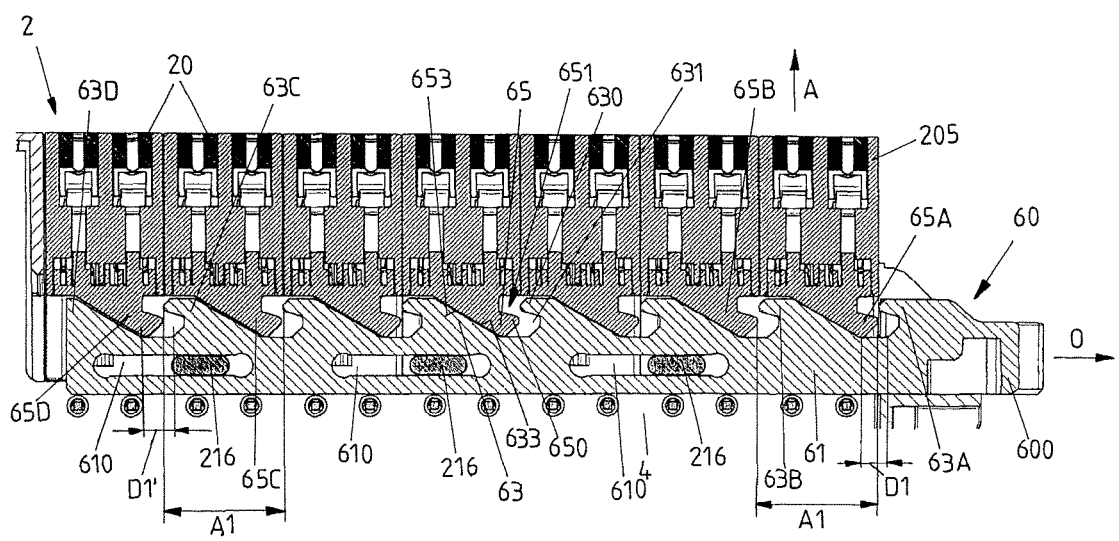
FIG. 9B the view according to FIG. 9A, but when the actuating part is actuated in order to unlock the plug modules from the base strip.

If, as shown in FIG. 9B, the actuating part 60 is displaced in the actuating direction O, the heads 630, 650 of the locking elements 63 and of the counter elements 65 are first disengaged from one another, so that the locking of the plug modules 20 to the base strip 21 is released. After the locking has been released, the ejection bevels 633 of the locking elements 63 come into abutment with ejection bevels 653 of the counter elements 65 of the plug modules 20, so that upon further actuation, the ejection bevels 633, 653 run onto one another and thus bring about ejection of the plug modules 20 in the ejection direction A, as shown in FIG. 9C.

FIG. 9C shows a state with an actuating part 60 that is maximally pulled out in the actuating direction O and in which the pins 215, 216 on the base strip 21 come to lie at the ends, facing away from the actuating portion 600, of the elongated holes 610, 620 of the arms 61, 62. In this maximally pulled-out state, the ejection bevels 633 of the locking elements 63 have run onto the ejection bevels 653 of the counter elements 65, so that the heads 630 of the locking elements 63 are in abutment with the heads 650 of the counter elements 65 on the outside. The plug modules 20 have thus been moved in the ejection direction A relative to the actuating part 60 and their plug-in portions 206 have thus been lifted at least partially out of the assigned plug receptacles 213 at the heads 211 of the base strip modules 210.

As can be seen in FIG. 9B, the ejection bevels 633 of the individual locking elements 63 are not arranged equidistantly from one another on the arms 61, 62 of the actuating part 60. Rather, the distances between the ejection bevels 633 along the actuating direction O vary in such a way that the ejection bevels 633 come into abutment with the assigned ejection bevels 653 of the counter elements 65 in a temporally staggered manner when the actuating part 60 is actuated.

In the exemplary embodiment described, in the position shown in FIG. 9B, the ejection bevel 633 of the locking element 63B (on the right in the view shown) is in abutment with the ejection bevel 653 of the counter element 65A, so that when the actuating part 60 is further actuated in the actuating direction O, the ejection of the assigned plug module 20 begins. In contrast, the ejection bevels 633 of the other locking elements 63 in this position are not yet in abutment with the assigned ejection bevels 653 of the counter elements 65, wherein the distance between the ejection bevels 633, 653 is enlarged counter to the actuating direction O and is greatest for the ejection bevels 633, 653 shown on the left in the view.

The distance D1, D1' to be covered by the actuating part 60 until the ejection bevels 633, 653 abut against one another is thus different for the individual locking elements 63. The distance D1 is smaller for the locking element 63B on the right in the view than for the other locking elements 63. The distance D1' is greatest for the locking element 63B on the far left in the view.

This results in the ejection bevels 633 of the locking elements 63 coming into abutment with the assigned ejection bevels 653 of the counter elements 65 in a temporally staggered manner when the actuating part 60 is actuated. As a result, the force to be applied for ejecting the plug modules 20 can be reduced, because in particular a breakaway force, i.e., a force for overcoming the adhesion, for the plug modules 20 is to be applied in a temporally staggered manner.

In the actuated position of the actuating part 60 shown in FIG. 9C, the plug modules 20 are at least partially lifted out of the base strip 21 in the ejection direction A. In order to prevent the plug modules 20 from being able to fall in an uncontrolled manner out of the assigned plug receptacles 213 of the base strip modules 210 of the base strip 21 when the plug modules 20 are ejected, an ejection securing means in the form of a knob-like projection 207 is attached to each plug-in portion 206 on the underside of the heads 205 of the plug modules 20 and comes into abutment with a securing portion 217 in the form of an edge portion on an assigned plug receptacle 213 of a base strip module 210 when a plug module 20 is moved in the ejection direction A.

In order to remove a plug module 20 from the base strip 21, a user can grasp the plug module 20 after actuation of the actuating part 60 and pull it out of the assigned plug receptacle 213 of the base strip module 210, wherein the projections 207 on the plug-in portions 206 of the plug module 20 can be moved past the securing portions 217 in the form of the upper edge portions of the plug receptacles 213 with comparatively little effort.

In the locking apparatus 6, the actuating part 60 is spring-preloaded in relation to the electronics housing 3 via a spring element 64, as shown in FIG. 13. In the exemplary embodiment shown, the spring element 64 is realized by a leaf spring and produced from a spring steel.

The spring element 64 is fastened with a first end 640 to a fastening apparatus 35, which is formed on the narrow end face 33 of the electronics housing 3, so that the spring element 64 is fastened to the end face 33 via the first end 640. The fastening apparatus 35 has holding elements 350 that form between them a receptacle into which the spring element 64 is inserted with the first end 640 in order to fasten it, so that the spring element 64 is thereby fixed to the electronics housing 3.

With a second end 641 facing away from the first end 640, the spring element 64 is in engagement with the handle 600 of the actuating part 60. The second end 641 engages in an opening 601 formed within the handle 600, so that an operative connection is thereby established between the spring element 64 and the actuating part 60.

When the actuating part 60 is actuated in the actuating direction B in order to unlock the plug modules 20, the spring element 64 is elastically loaded. The actuation of the actuating part 60 thus takes place against the spring preloading of the spring element 64, which results in a restoring force acting on the actuating part 60 after actuation of the actuating part 60 has taken place, and the actuating part 60 thus being autonomously returned, due to this restoring force, to a starting position corresponding to the locked position.

In that the spring element 64 brings about a preloading between the actuating part 60 and the electronics housing 3, the spring element 64 can be preassembled in a simple manner. For preassembly, the spring element 64 can thus be arranged on the electronics housing 3 or on the actuating part 60, so that within the framework of delivery of an assembly set, the electronics housing 3 or the actuating part 60 can be delivered with a spring element 64 preassembled thereon. The assembly of the electronic device 1 can thereby be facilitated and can be automatable in a simple manner.

The idea underlying the invention is not limited to the exemplary embodiments described above but can also be realized in completely different embodiments.

In particular, all the plug modules do not necessarily have to be of the same design but can also differ, as shown in FIG. 1. A plug module can in this case also be in engagement with a plurality of locking element pairs of the actuating part and thus be held on the base strip in a locking manner via a plurality of locking element pairs.

The base strip can in principle be designed in any way and is not necessarily formed from a plurality of base strip modules that are separate from one another in a preassembly state. A base strip can also be formed in one piece as a single-piece strip.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Electronic device
2 Terminal strip
20, 20A-20F Plug module
200 Contact receptacle
201 Contact
202 Plug connector part
203 Adjustment element
204 Indicator element
205 Head
206 Plug-in portion
207 Ejection securing means (projection)
21 Base strip
210 Base strip module
211 Head
212 Base
213 Plug receptacle
215, 216 Guide pin
217 Securing portion
3 Electronics housing
30 Insertion opening
31-34 Wall
330 Engagement opening
35 Fastening apparatus
350 Holding element
4 Electronics component (printed circuit board)
40 Contact openings
5 Single conductor
6 Locking apparatus
60 Actuating part (actuating slide)
600 Handle
601 Opening
61 Arm
610 Elongated hole
62 Arm
620 Elongated hole
63, 63A-63D Locking element
630 Head
631 Engagement opening
632 Unlocking bevel
633 Ejection bevel
64 Spring element
640, 641 End
65, 65A-65D Counter element
650 Head
651 Engagement opening
652 Unlocking bevel
653 Ejection bevel
7 Tool
70 Shank
71 Shank tip
A Ejection direction
A1 Distance
B Width direction
D1, D1' Distance
E Insertion direction
H Alignment direction
O Actuating direction
P Direction
T Depth direction

The invention claimed is:

1. An assembly of an electronic device, comprising:
an electronics housing configured to accommodate an electronic component;
a base strip attachable to the electronics housing and having a plurality of plug receptacles to which plug modules are attachable; and
a locking apparatus configured to lock the plug modules to the plug receptacles of the base strip,
wherein the locking apparatus has an actuating part movable in an actuating direction away from the electronics housing in order to remove the plug modules from the base strip,
wherein a spring element is arranged on the electronics housing and configured to preload the actuating part in relation to the electronics housing counter to the actuating direction, and
wherein the spring element is arranged on an end face of the electronics housing such that the spring element extends perpendicularly to the actuating direction.

2. The assembly of claim 1, wherein the spring element comprises a leaf spring.

3. The assembly of claim 1, wherein the spring element is arranged with a first end on the electronics housing and is operatively connected on a second end to the actuating part.

4. The assembly of claim 3, wherein the actuating part has a handle operable by a user and that forms an opening, and wherein the spring element engages with the second end in the opening.

5. The assembly of claim 1, wherein the actuating part comprises an actuating slide arranged displaceably along the actuating direction on the base strip or on the electronics housing.

6. The assembly of claim 1, wherein the actuating part has a plurality of locking elements that are configured to lock counter elements of the plug modules in a locked position such that the plug modules are locked relative to the base strip counter to the insertion direction.

7. The assembly of claim 6, wherein a plurality of locking elements of the actuating part are spaced apart from one another along the actuating direction.

8. The assembly of claim 1, wherein the actuating part has two arms, each having a plurality of locking elements.

9. The assembly of claim 8, wherein the arms extend on both sides of the base strip so that the base strip is arranged between the arms.

10. The assembly of claim 8, wherein the arms are guided longitudinally on the base strip along the actuating direction.

11. The assembly of claim 1, wherein the base strip comprises a plurality of base strip modules that are attached to one another along an alignment direction to form the base strip.

12. The assembly of claim 11, wherein at least one plug module is attachable to each base strip module.

13. The assembly of claim 1, wherein the base strip is connectable to the electronic component and a predetermined number of electrical single conductors or plugs are connectable to each plug module.

14. An electronic device, comprising:
the assembly of claim 1,
wherein an electronic component is arranged in the electronics housing and the base strip is connected to the electronic component.

15. An assembly of an electronic device, comprising:
an electronics housing configured to accommodate an electronic component;
a base strip attachable to the electronics housing and having a plurality of plug receptacles to which plug modules are attachable; and
a locking apparatus configured to lock the plug modules to the plug receptacles of the base strip,
wherein the locking apparatus has an actuating part movable in an actuating direction away from the electronics housing in order to remove the plug modules from the base strip,
wherein a spring element is arranged on the electronics housing and configured to preload the actuating part in relation to the electronics housing counter to the actuating direction, and
wherein the spring element comprises a leaf spring.

* * * * *